(12) United States Patent
Yun

(10) Patent No.: US 6,996,018 B2
(45) Date of Patent: Feb. 7, 2006

(54) METHOD FOR SENSING BIT LINE WITH UNIFORM SENSING MARGIN TIME AND MEMORY DEVICE THEREOF

(75) Inventor: Joon-Yul Yun, Ichon-shi (KR)

(73) Assignee: Hynix Semiconductor Inc., (KR)

( * ) Notice: Subject to any disclaimer, the term of this patent is extended or adjusted under 35 U.S.C. 154(b) by 59 days.

(21) Appl. No.: 10/749,352

(22) Filed: Dec. 31, 2003

(65) Prior Publication Data

US 2004/0218447 A1    Nov. 4, 2004

(30) Foreign Application Priority Data

Apr. 30, 2003 (KR) ............... 10-2003-0027684

(51) Int. Cl.
*G11C 7/00* (2006.01)
(52) U.S. Cl. ............... 365/205; 365/207
(58) Field of Classification Search ............... None
See application file for complete search history.

(56) References Cited

U.S. PATENT DOCUMENTS 5,267,203 A * 11/1993 Hwang et al. ............... 365/190
5,610,868 A    3/1997 Inaba et al.
5,892,722 A    4/1999 Jang et al.
6,009,040 A   12/1999 Choi et al.
6,038,180 A    3/2000 Hoshi
6,891,773 B2 *  5/2005 Park ............... 365/230.06

FOREIGN PATENT DOCUMENTS

| JP | 01-173390 | 7/1989 |
|----|-----------|--------|
| JP | 02-189791 | 7/1990 |
| JP | 03-016082 | 1/1991 |
| JP | 04-192182 | 7/1992 |
| JP | 05-013709 | 1/1993 |
| JP | 09-180472 | 7/1997 |
| JP | 11-039899 | 2/1999 |

* cited by examiner

*Primary Examiner*—Tan T. Nguyen
(74) *Attorney, Agent, or Firm*—Blakely, Sokoloff, Taylor & Zafman (57) ABSTRACT

A semiconductor memory device having a uniform bit line sensing margin time independent on an external voltage variation, includes: a memory cell coupled to a bit line and a word line; an amplifier for amplifying an electric potential of the bit line; a first control signal generator to which an external voltage is supplied for activating the word line; and a second control signal generator to which a core voltage is supplied for controlling an execution of the amplifier by receiving the first control signal.

9 Claims, 11 Drawing Sheets

START BIT LINE SENSING

SENSING MARGIN TIME

METHOD FOR SENSING BIT LINE WITH UNIFORM SENSING MARGIN TIME AND MEMORY DEVICE THEREOF

FIELD OF THE INVENTION

The present invention relates to a semiconductor memory device; and, more particularly, to a memory device and a method sensing bit line with a uniform sensing margin time regardless of variation of an external supply voltage.

DESCRIPTION OF RELATED ART

Generally, a memory device such as a dynamic random access memory has a bit line sense amplifier for amplifying a delicate electric potential difference between a pair of bit lines in order to execute a read operation or a write recovery operation.

After a bit line floating operation is performed that a bit line precharging operation is disabled, a word line is activated. Then, the bit line sense amplifier waits performing an amplification of an electric potential difference of a bit line pair until enough amount of electric potential difference is charged between a bit line pair in order to execute a stable sensing operation. Herein, an amount of time between the activation of the word line and the amplification of the electric potential difference of the bit line pair is called 'sensing margin time'.

Figure 1:
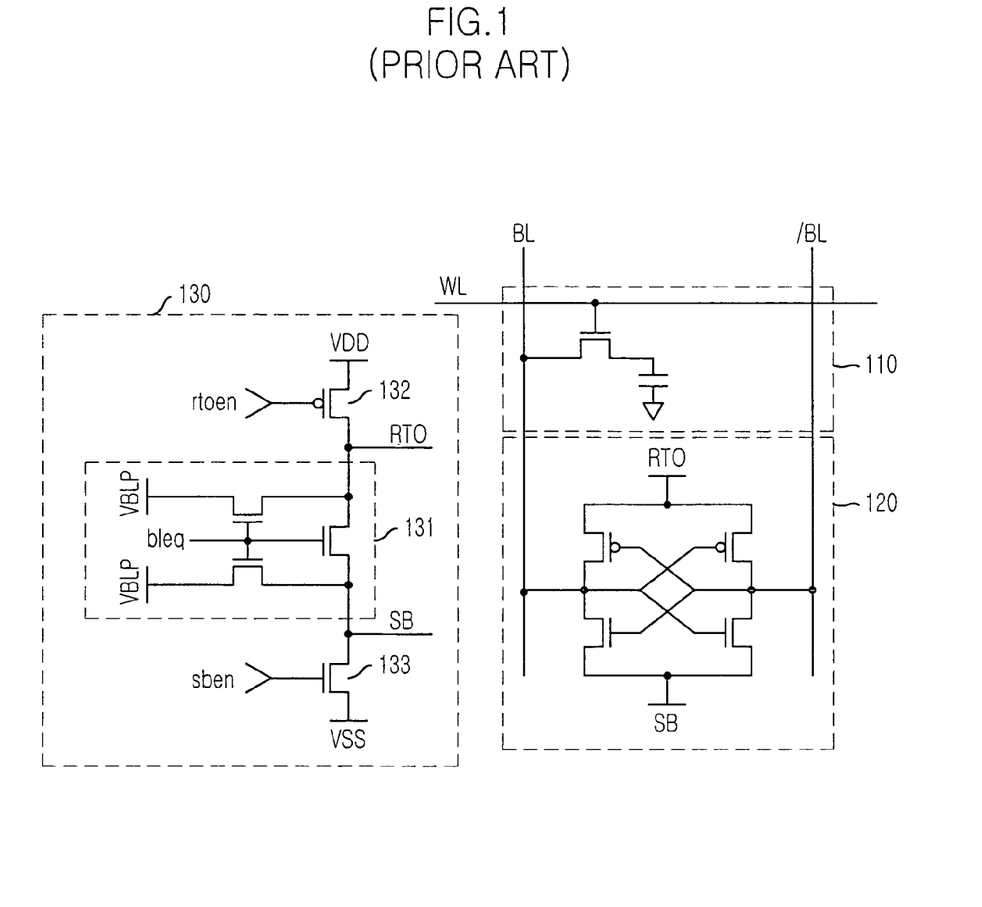
FIG. 1 is a circuit diagram showing a conventional bit line sense amplifier and a convention driving voltage generator.

FIG. 1 is a circuit diagram showing a conventional bit line sense amplifier and a convention driving voltage generator.

Referring to FIG. 1, a memory cell 110 is coupled to a bit line and a sense amplifier 120 is coupled to a bit line pair BL and /BL. The sense amplifier 120 has a latch structure and amplifies an electric potential difference between the bit line pair BL and /BL. Driving voltages RTO and SB are generated from a driving voltage generator 130 and supplied to the sense amplifier 120.

The supply voltage generator 130 includes a precharging unit 131, a PMOS transistor 132 and an NMOS transistor 133.

The precharging unit 131 precharges and equalizes a pair of driving voltage terminals by using a precharge voltage with responding to a precharge control signal bleq. The PMOS transistor 132 of the driving voltage is to perform a pull up operation of sources of PMOS transistors in the sense amplifier 120, with a power supply voltage VDD level with responding to an enable signal rtoen. The NMOS transistor 133 is to perform a pull down operation of sources of NMOS transistors in the sense amplifier 120 to a ground voltage VSS level with responding to an enable signal sben.

Figure 2:
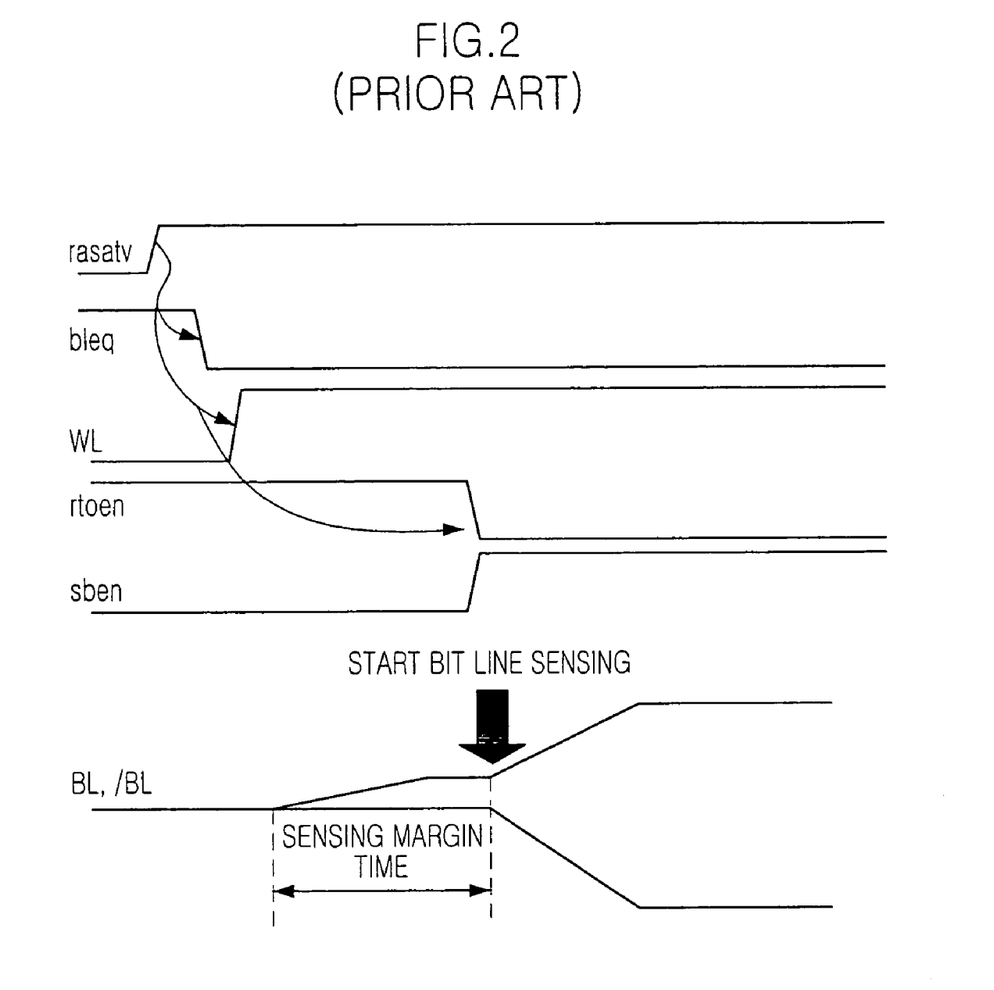
FIG. 2 is a timing diagram showing a conventional bit line sensing operation in the conventional sense amplifier.

FIG. 2 is a timing diagram showing a conventional bit line sensing operation in the conventional sense amplifier. A bit line sensing operation will be described.

As shown, as an active signal rasatv is activated with a logic high level and the bit line precharge signal bleq is inactivated with a logic low level, the bit line precharging unit is disabled and a bit line pair becomes a floating state. A word line WL of a memory cell selected by performing a row decoding operation is activated to a logic high level and enable signals rtoen and sben are activated to start an operation of the sense amplifier 120 after a predetermined sensing margin time. The sensing margin time is determined to have enough amount of electric potential difference between the bit line pair. Finally, the sense amplifier 120 is operated and the delicate electric potential difference of the bit line pair BL and /BL is amplified to a supply voltage and a ground voltage.

Figure 3:
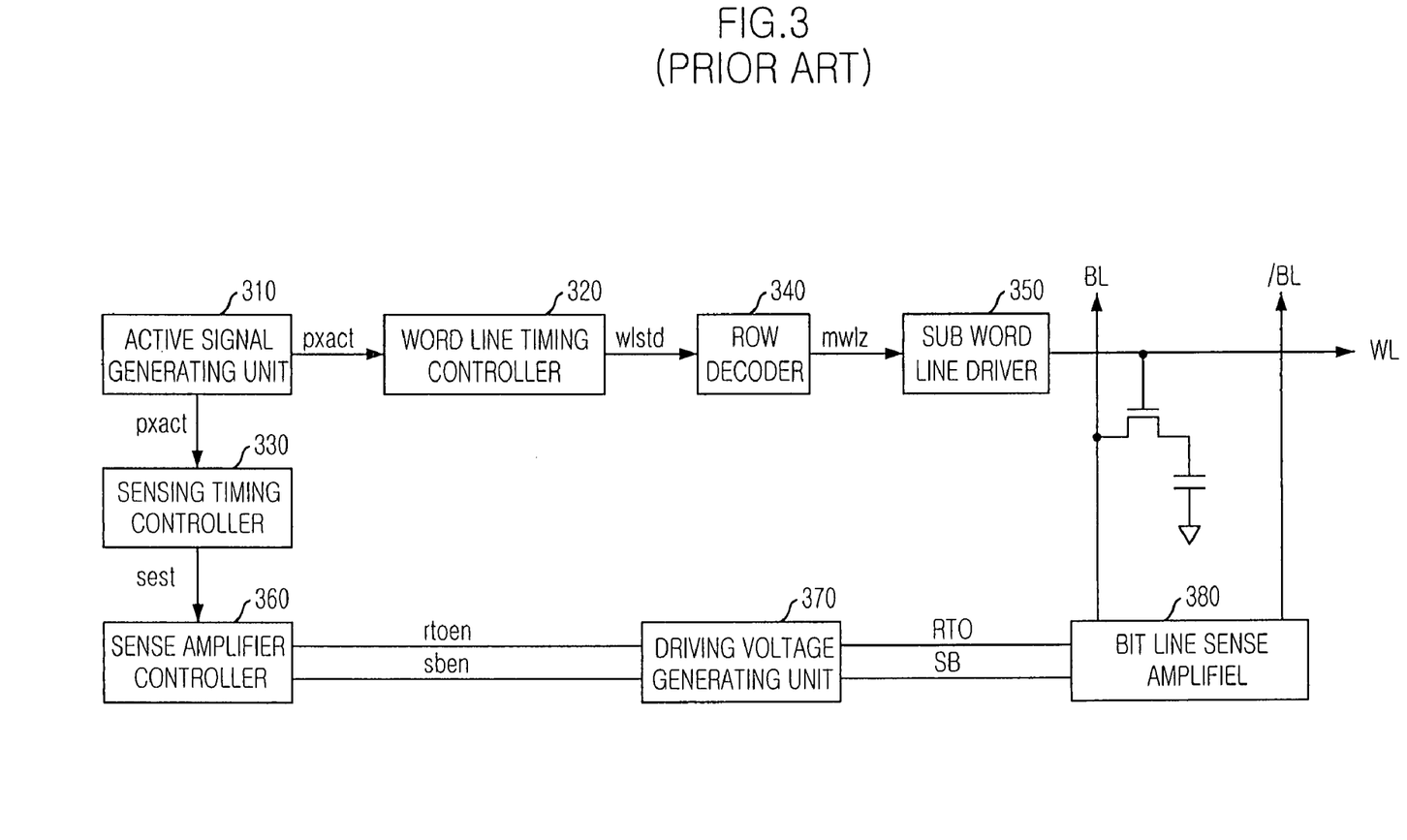
FIG. 3 is a block diagram showing control flows of a conventional word line and a bit line sense amplifier.

FIG. 3 is a block diagram showing control flows of a conventional word line and a bit line sense amplifier.

As shown in FIG. 3, an active signal generator 310 generates an active signal pxact by combining external inputs to a chip. The active signal pxact is enabled during an active operation and disabled during a precharge operation.

A word line timing controller 320 generates a control signal wlstd and a sensing timing controller 330 generates a control signal sest with responding to the active signal pxact. The control signal sest is a timing control signal for controlling timing of sense amplifier enable signals rtoen and sben.

A row address rowadd is decoded in a row decoder 340 with responding to the control signal wlstd and a word line selected by a sub word line driver 350 is activated.

A sense amplifier 360 generates enable signals rtoen and sben with responding to the control signal sest. A supply voltage generator 370 generates driving voltages RTO and SB with responding to the enable signals rtoen and sben and a bit line sense amplifier 380 amplifies data supplied to the bit line. The word line timing controller 320 and the sensing timing controller 330 are typical CMOS delay circuits and a predetermined amount of delay is set to a corresponding specification of the CMOS delay circuit.

It is broadly known that a constant core voltage Vcore generated in a chip is used for a core circuit unit and an external voltage Vext is used for peripheral circuits. That is, the external voltage Vext is supplied to the peripheral circuits of the active signal generator 310, the word line timing controller 320, the sensing timing controller 330, the sense amplifier controller 360 and the supply voltage generator 370.

However, the external voltage Vext varies with many reasons. It is a problem that the sensing margin time obtained from the delay circuit of the sensing timing controller 330 varies according to the external voltage Vext.

Therefore, in a modified conventional art, the core voltage Vcore is used as a supply voltage to a delay circuit of the sensing timing controller 330.

Figure 4:
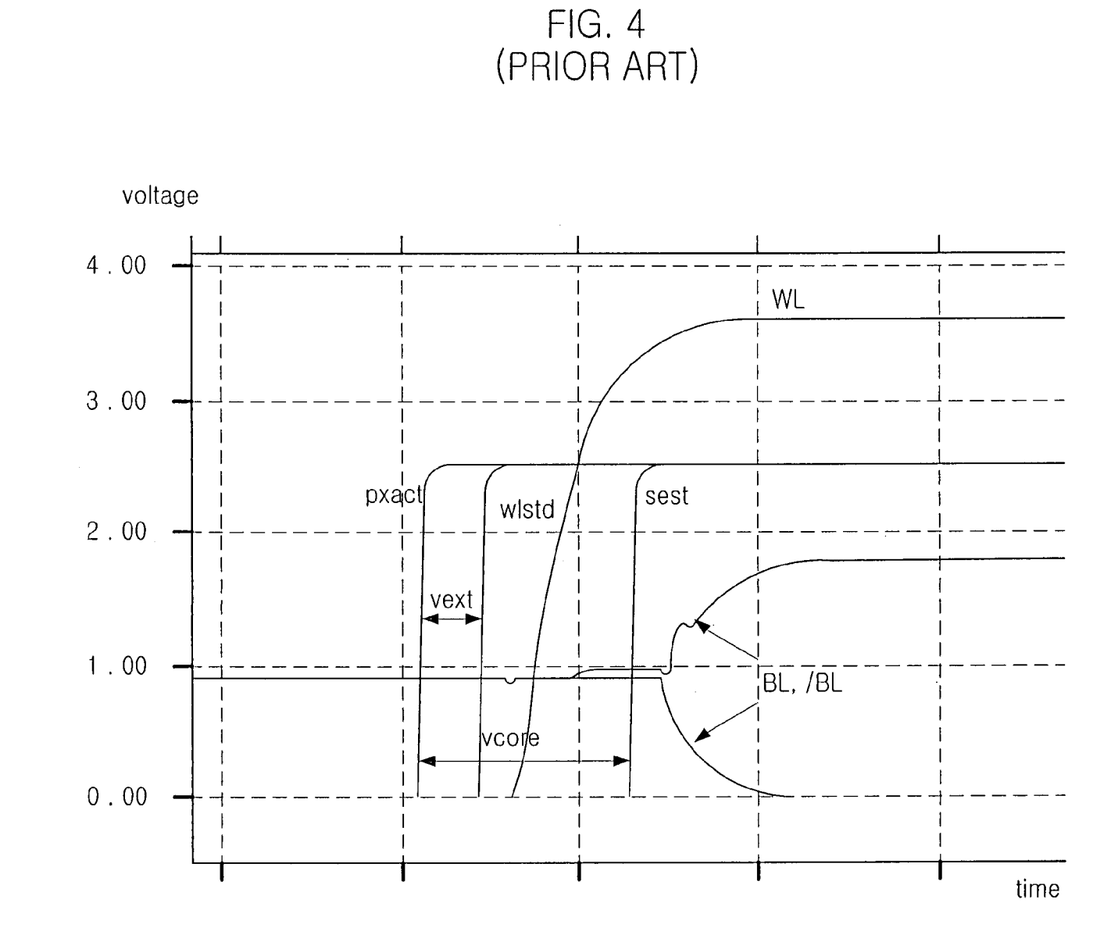
FIG. 4 is a timing diagram showing control signals of a modified conventional art.

FIG. 4 is a timing diagram showing control signals of a modified conventional art.

Referring to FIG. 4, the active signal pxact is enabled and with responding to the active signal pxact, a delay is given for an amount of a first delay generated by the word line timing controller 320 to which the external voltage Vext is supplied. Then, the control signal wlstd is enabled.

With responding to the active signal pxact, a delay is given for an amount of a second delay generated by the sensing timing controller 330 to which the core voltage Vcore is supplied. Then, the control signal sest is enabled.

However, the modified conventional art has a problem that variation of the external voltage Vext still largely affects the sensing margin time, which is the time between the activation of word line and the start of the bit line sense amplification.

The problem mentioned above is explained in details as follows.

The word line control signal wlstd largely varies according to the variation of the external voltage Vext because the word line control signal is generated by the delay circuit to which the external voltage Vext is supplied.

However, the control signal sest which controls the operation of the sense amplifier is constantly activated because the control signal sest is generated by the delay circuit to which the core voltage Vcore is supplied.

Figure 5:
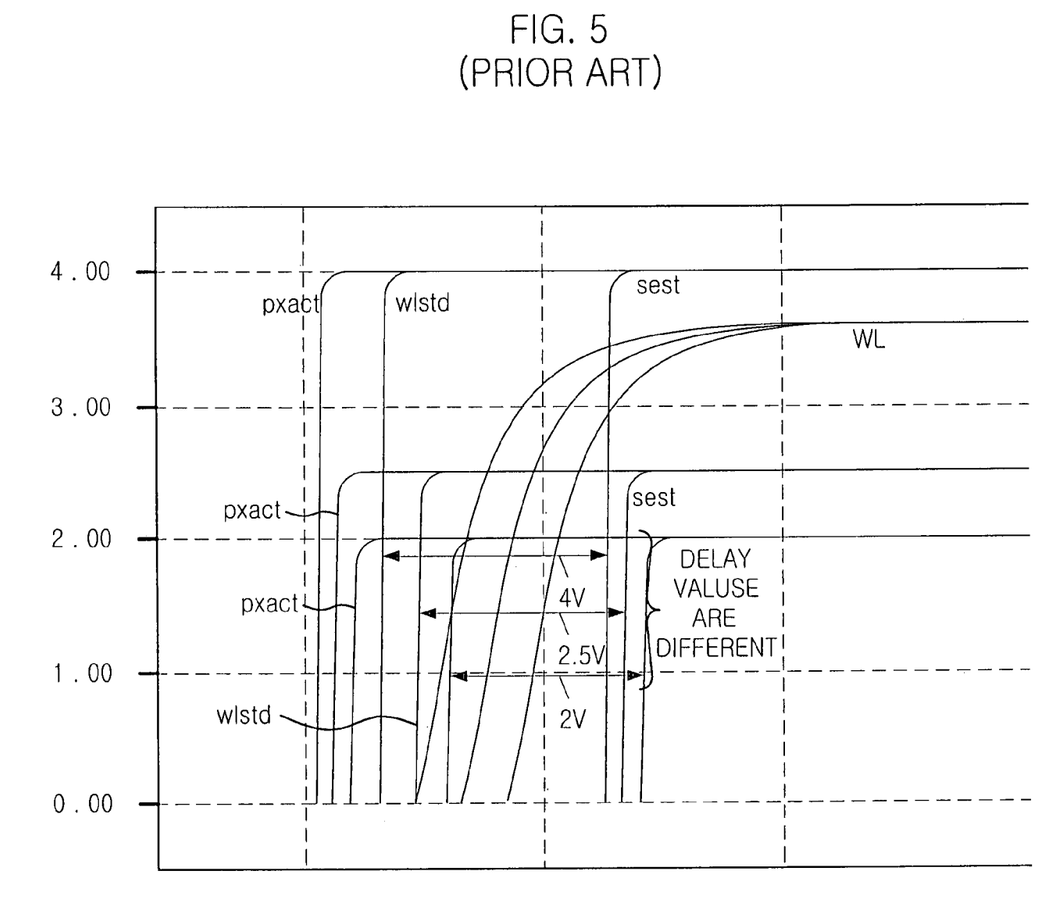
FIG. 5 is a timing diagram illustrating control signals of the convention art according to external voltages, e.g., 2V, 2.5V and 4V.

FIG. 5 is a timing diagram illustrating control signals of the convention art according to external voltages, e.g., 2V, 2.5V and 4V.

Referring to FIG. 5, the sensing margin time which is the time between the activation of the word line and the bit line amplification varies according to the variations of the external voltage.

SUMMARY OF THE INVENTION

Therefore, it is an object of the present invention to provide a memory device and a bit line sensing method having a uniform sensing margin time regardless of variations of an external supply voltage.

In accordance with one aspect of the present invention, there is provided a semiconductor memory device having a uniform bit line sensing margin time independent on an external voltage variation, including: a memory cell coupled to a bit line and a word line; an amplifier for amplifying an electric potential of the bit line; a first control signal generator to which an external voltage is supplied for activating the word line; and a second control signal generator to which a core voltage is supplied for controlling an execution of the amplifier by receiving the first control signal.

Further, in accordance with another aspect of the present invention, there is provided an operating method of a semiconductor memory device having a memory cell coupled to a word line and a bit line, including the steps of: a) generating a first control signal by supplying an external voltage in order to activate the word line; and b) generating a second control signal by supplying a core voltage in order to amplifying an electric potential of the bit line by receiving the first control signal.

Further, in accordance with still another aspect of the present invention, there is provided a semiconductor memory device, including: a memory cell coupled to a bit line and a word line; an amplifier unit which is coupled to the bit line for amplifying an electric potential of the bit line; an active signal generating unit to which an external voltage is supplied for generating an active signal that is activated during an active operation and inactivated during a precharge operation; a word line timing controller to which the external voltage is supplied for generating a first control signal in order to activate a word line by receiving the active signal;

a row decoder/driver for activating a chosen word line with responding to the first control signal; a sensing timing controller to which a core voltage is supplied for generating a second control signal in order to control the amplifier unit by receiving the first control signal; and a sense amplifier controller for generating an enable signal of the amplifier unit with responding to the second control signal.

BRIEF DESCRIPTION OF THE DRAWINGS

The above and other objects and features of the instant invention will become apparent from the following description of preferred embodiments taken in conjunction with the accompanying drawings, in which.

DETAILED DESCRIPTION OF THE INVENTION

Other objects and aspects of the invention will become apparent from the following description of the embodiments with reference to the accompanying drawings, which is set forth hereinafter.

Figure 6:
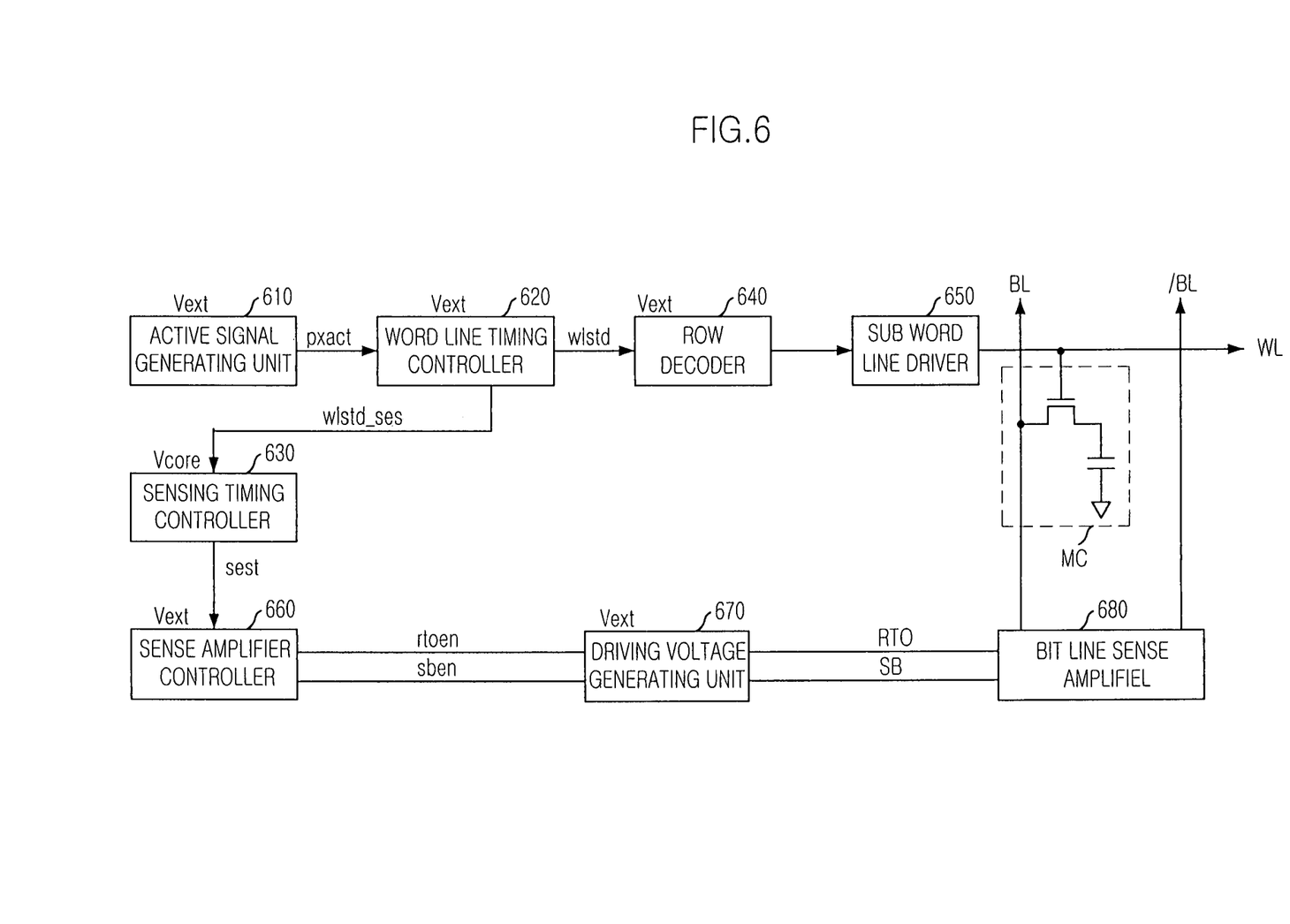
FIG. 6 is a block diagram showing control flows of a word line and a bit line sense amplifier of a synchronous dynamic random access memory (SDRAM) in accordance with a preferred embodiment of the present invention.

FIG. 6 is a block diagram showing control flows of a word line and a bit line sense amplifier of a synchronous dynamic random access memory (SDRAM) in accordance with a preferred embodiment of the present invention.

Referring to FIG. 6, a memory cell MC including one transistor and one capacitor is coupled to a word line WL and a bit line BL. A bit line sense amplifier 680 is coupled to a bit line pair BL and /BL in order to amplify an electric potential of a bit line. An external voltage Vext is supplied to a driving voltage generator 670 and driving voltages RTO and SB are generated. The driving voltages RTO and SB are supplied to the bit line sense amplifier 680.

The memory device of the present invention includes an active signal generator 610, a word line timing controller 620, a sensing timing controller 630, a row decoder 640, a sub-word line driver 650, a sense amplifier controller 660 and a driving voltage generator 670.

An active signal pxact is generated from the active signal generator 610 to which the external voltage is supplied. The active signal pxact is enabled at an active operation and disabled at a precharge operation. If the word line timing controller 620 receives the active signal pxact, a word line control signal wlstd is generated from the word line timing controller 620 to which the external voltage is supplied. The row decoder 640 and the sub-word line driver 650 activate a chosen word line WL with responding to the word line control signal wlstd. A control signal wlstd_ses is outputted from the word line timing controller 620 and inputted to the sensing timing controller 630. The control signals wlstd and wlstd_ses are outputted from the word line timing controller 620.

The sensing timing controller 630 receives the control signal wlstd_ses and generates a control signal sest in order to control the sense amplifier controller 660. The sense amplifier controller 660 generates enable signals rtoen and sben with responding to the control signal sest.

Figure 7:
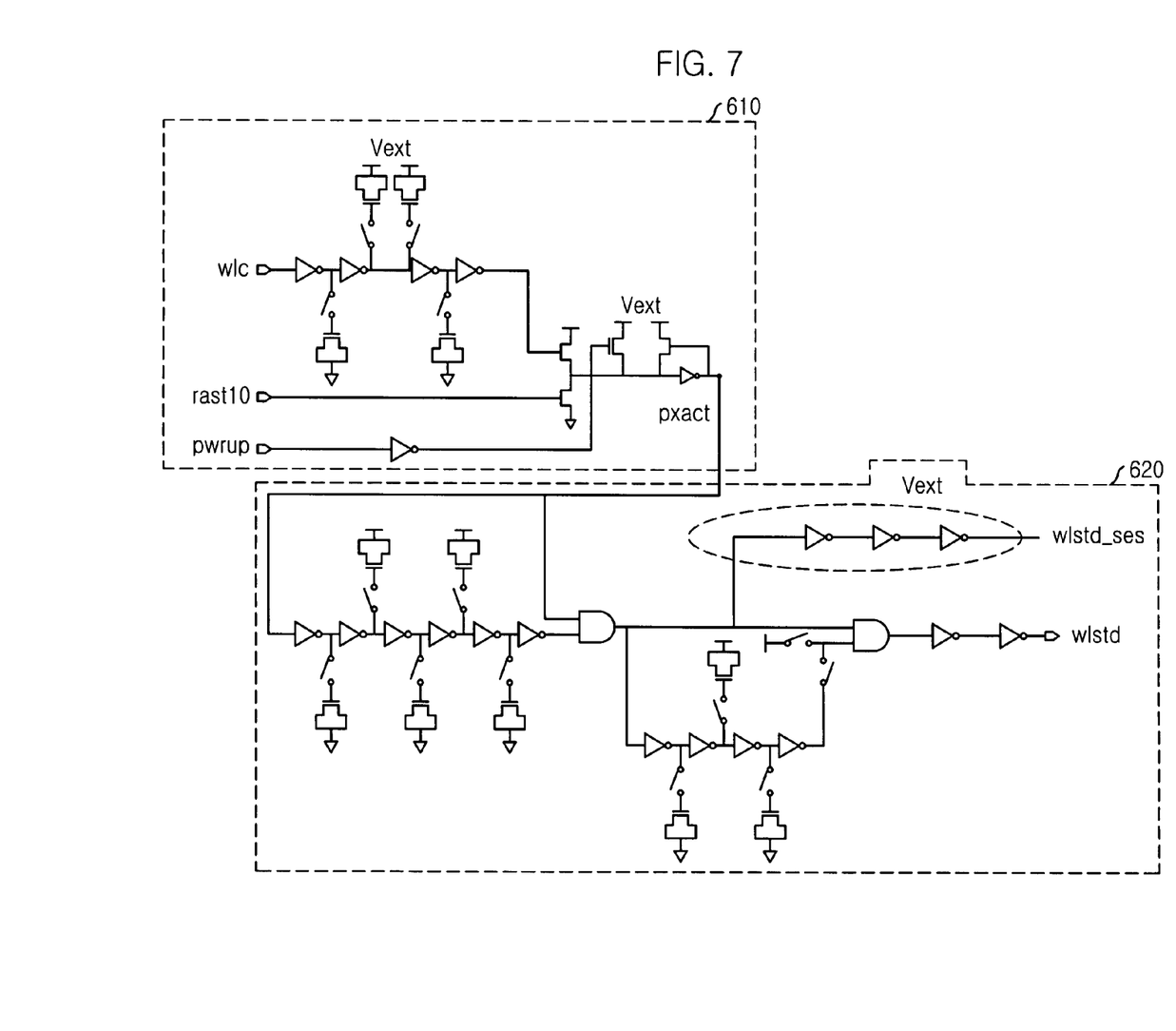
FIG. 7 is a circuit diagram illustrating the active signal generating unit and the word line timing controller in accordance with the present invention.

FIG. 7 is a circuit diagram illustrating the active signal generating unit 610 and the word line timing controller 620 in accordance with the present invention.

As shown, the active signal generating unit 610 receives a word line clear signal wlc, a word line enable signal rast10 and a power-up signal, and generates the active signal pxact. The word line clear signal wlc is to disable the word line in a precharge operation and the word line enable signal rast10 is to enable the word line, wherein the word line enable signal rast10 becomes a logic high level in an active mode. The power up signal pwrup is to remove a floating node in the active signal generating unit 610.

The word line timing controller 620 receives the active signal from the active signal generating unit 610 and generates the control signals wlstd_ses and wlstd. The word line timing controller 620 is a delay circuit for notifying an activation of the word line.

Figure 8:
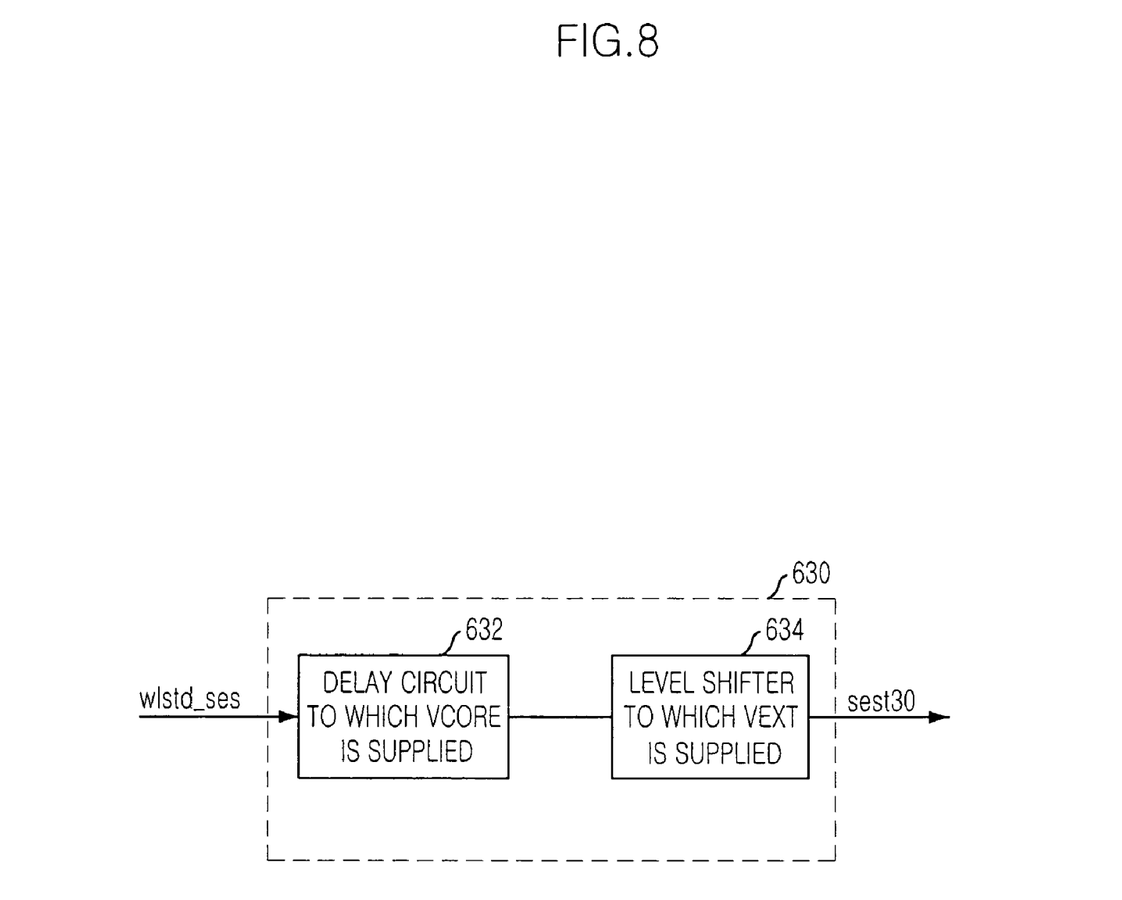
FIG. 8 is a block diagram showing a sensing timing controller for performing a level-shifting operation in accordance with the present invention.

FIG. 8 is a block diagram showing a sensing timing controller 630 for performing a level-shifting operation in accordance with the present invention.

Referring to FIG. 8, the sensing timing controller 630 includes a delay circuit 632 to which the core voltage Vcore is supplied and a level-shifter 634 to which the external voltage Vext is supplied. The delay circuit 632 receives the control signal wlstd_ses and performs a delay operation according to the sensing margin time. Then, the level-shifter 634 performs a level-shifting operation of the signal received from the delay circuit 632 to thereby generate the control signal sest30. The power up signal pwrup applied to the level-shifter 634 is to remove a floating node.

The level-shifter 634 can be implemented in an input unit of the sense amplifier controller 660 or in a circuit block between the sensing timing controller 630 and the sense amplifier controller 660.

Figure 9:
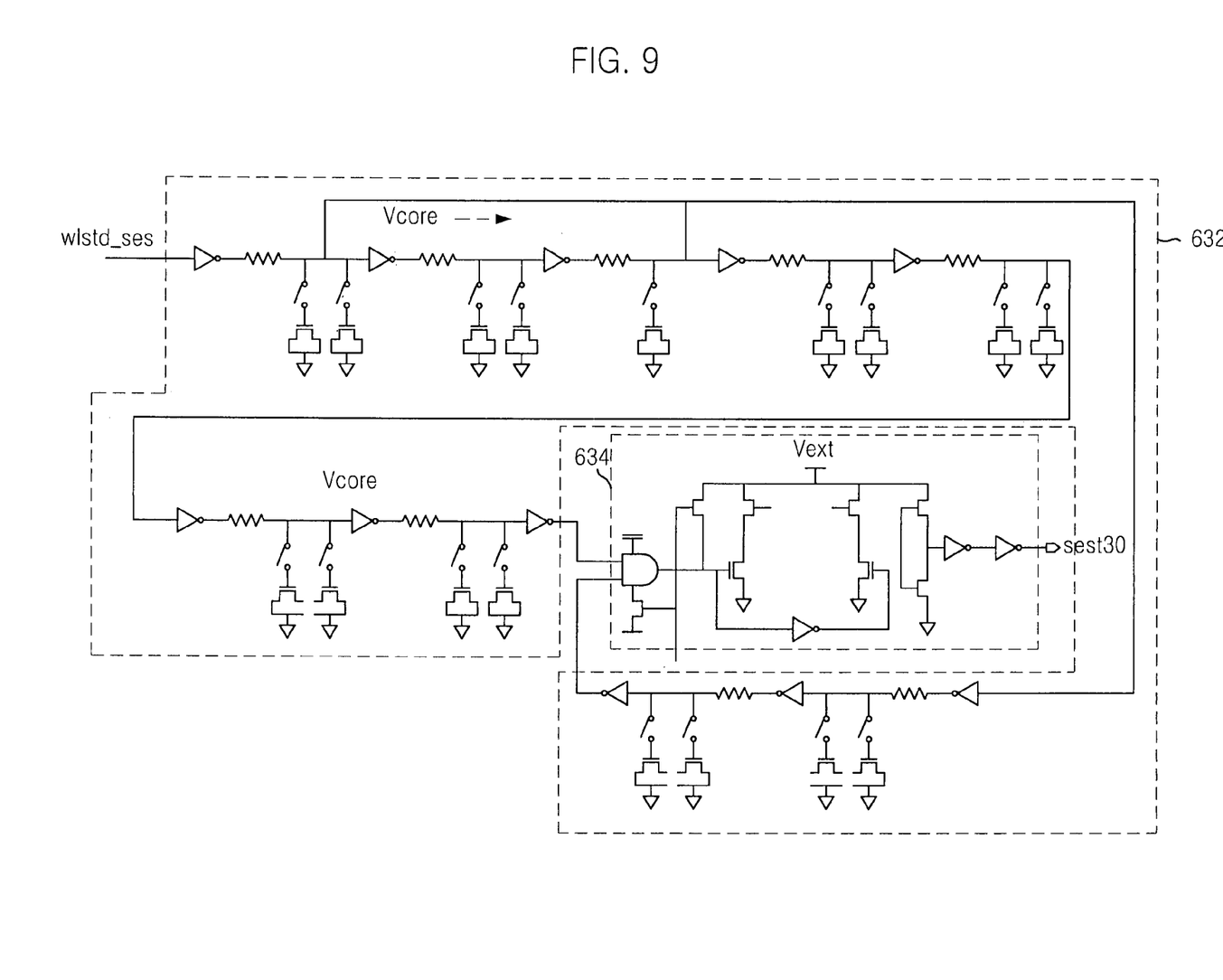
FIG. 9 is a circuit diagram illustrating the sensing timing controller having the delay circuit and the level-shifter in accordance with the present invention.

FIG. 9 is a circuit diagram illustrating the sensing timing controller 630 having the delay circuit 632 and the level-shifter 634 in accordance with the present invention.

As shown, the sensing timing controller 630 receives the control signal wlstd_ses from the word line timing controller 620 and generates the control signal sest30. The delay circuit 632 is configured with a plurality of inverters, resistors and transistors coupled in series each other.

The control signal sest is generated by delaying the active signal pxact in the conventional art in FIG. 3. However, the control signal sest30 is generated by delaying the control signal wlstd_ses in the present invention. Also, the control signal wlstd_ses is generated by the word line timing controller 620 to which the external voltage is supplied and the control signal sest30 is generated by the sensing timing controller 630 to which the core voltage is supplied.

Figure 10:
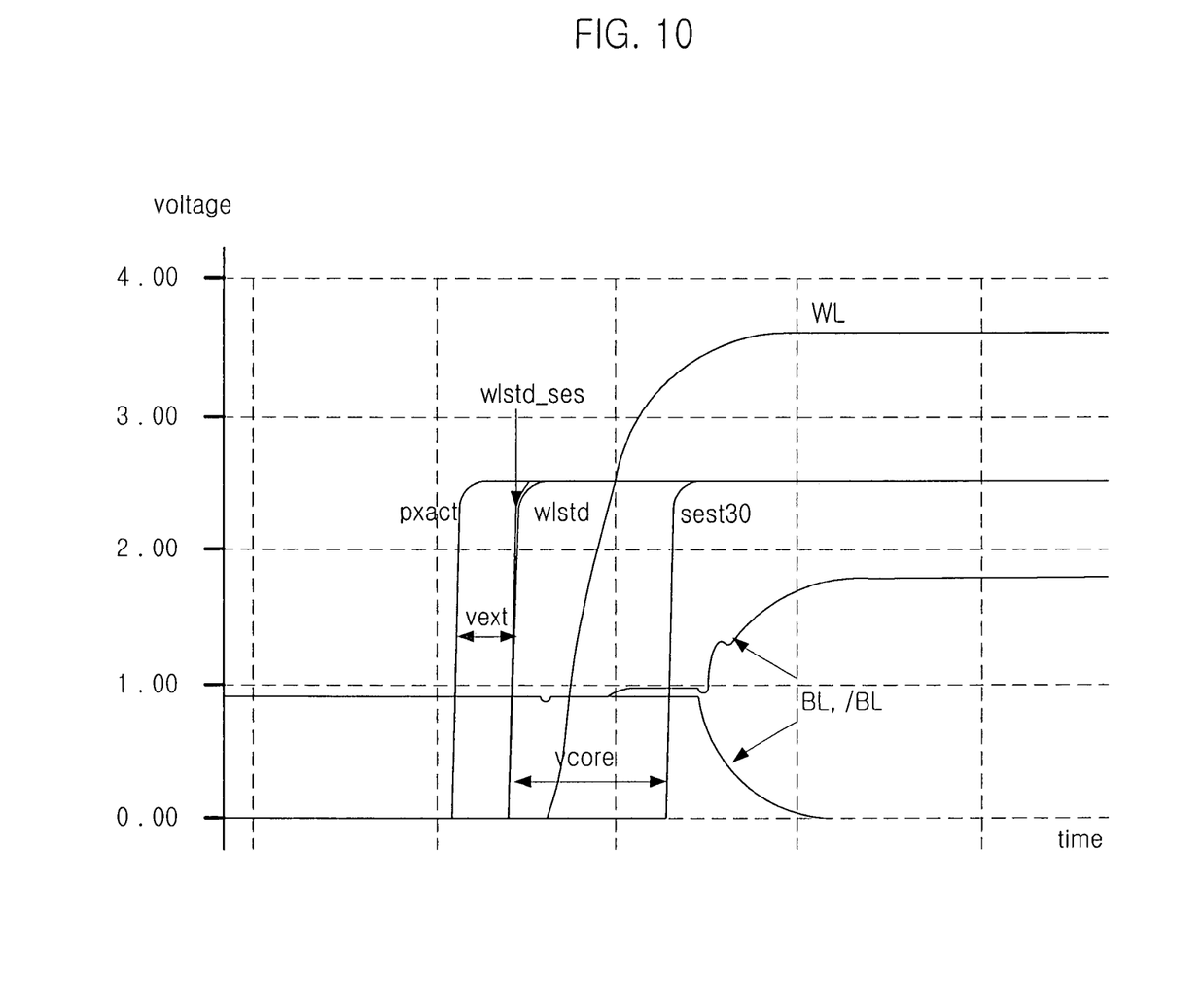
FIG. 10 is a timing diagram showing control signals for a bit line sensing operation in accordance with the present invention.

FIG. 10 is a timing diagram showing control signals for a bit line sensing operation in accordance with the present invention.

Referring to FIG. 10, the control signals wlstd and wlstd_ses are generated by the word line timing controller 620 to which the external voltage is supplied and the control signal wlstd_ses is generated by the sensing timing controller 630 to which the core voltage is supplied.

Because the sensing timing controller 630 uses the core voltage and the control signal sest30 outputted from the sensing timing controller 630 is inputted to the sense amplifier controller 660, it is preferred that the control signal sest30 is level-shifted corresponding to a power level of the external voltage through a level shifter 700 in the sensing timing controller 630.

Figure 11:
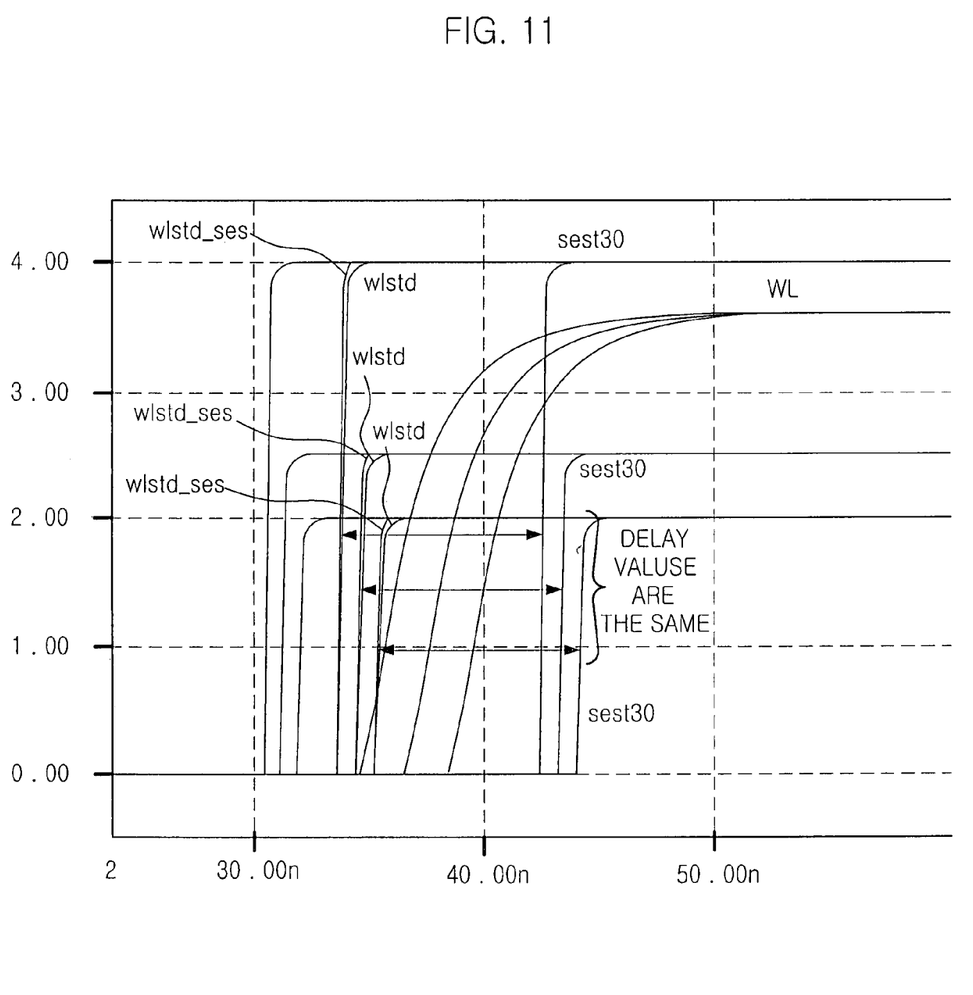
FIG. 11 is a timing diagram showing control signals in accordance with the present invention when an external voltage is varied to 2V, 2.5V and 4V.

FIG. 11 is a timing diagram showing control signals in accordance with the present invention when an external voltage is varied to 2V, 2.5V and 4V.

Referring to FIG. 11, the sensing margin times are uniform although the external voltage is varied to 2V, 2.5V and 4V. That is, a stable bit line sensing operation is performed because the bit line amplification is started if data are supplied to the cell for a uniform duration after the word line is activated.

The present invention can provide a stable data sensing operation by keeping a uniform sensing margin time regardless of the variation of the external supply voltage.

While the present invention has been shown and described with respect to the particular embodiments, it will be apparent to those skilled in the art that many changes and modifications may be made without departing from the spirit and scope of the invention as defined in the appended claims.

What is claimed is:

1. A semiconductor memory device having a uniform bit line sensing margin time independent on an external voltage variation, comprising:
   a memory cell coupled to a bit line and a word line;
   an amplification means for amplifying an electric potential of the bit line;
   a first control signal generating means to which an external voltage is supplied for activating the word line; and
   a second control signal generating means to which a core voltage is supplied for controlling an execution of the amplification means by receiving a first control signal.

2. The semiconductor memory device as recited in claim 1, wherein the second control signal generating means includes a delay circuit to which the core voltage is supplied for performing a delay operation of the first control signal by a delay as much as the sensing margin time of the amplification means.

3. The semiconductor memory device as recited in claim 1, further comprising:
   a level shifting means to which the external voltage is supplied for performing a level shifting operation of a voltage level of the second control signal.

4. An operating method of a semiconductor memory device having a memory cell coupled to a word line and a bit line, comprising the steps of:
   a) generating a first control signal by supplying an external voltage in order to activate the word line; and
   b) generating a second control signal by supplying a core voltage in order to amplifying an electric potential of the bit line by receiving the first control signal.

5. The method as recited in claim 4, wherein said step b) includes the step of:
   b1) performing a delay operation of the first control signal by a delay as much as the sensing margin time,
   wherein the delay operation is executed by supplying the core voltage.

6. The method as recited in claim 4, further comprising the step of:
   c) performing a level shifting operation of a power level of the second control signal,
   wherein the level shifting operation is executed by supplying the external voltage.

7. A semiconductor memory device, comprising:
   a memory cell coupled to a bit line and a word line;
   an amplification means which is coupled to the bit line for amplifying an electric potential of the bit line;

an active signal generating means to which an external voltage is supplied for generating an active signal that is activated during an active operation and inactivated during a precharge operation;

a word line timing control means to which the external voltage is supplied for generating a first control signal in order to activate a word line by receiving the active signal;

a row decoder/driver for activating a chosen word line with responding to the first control signal;

a sensing timing control means to which a core voltage is supplied for generating a second control signal in order to control the amplification means by receiving the first control signal; and a sense amplifier control means for generating an enable signal of the amplification means with responding to the second control signal.

8. The semiconductor memory device as recited in claim 7, further including:

a level shifting means to which the external voltage is supplied for performing a level shifting operation of a power level of the second control signal and outputting the level shifted signal to the sense amplifier control means, wherein the external voltage is supplied to the sense amplifier control means.

9. The semiconductor memory device as recited in claim 7, wherein the amplification means includes:

an amplifier for amplifying a signal of the bit line; and a supply voltage generating means for generating a supply voltage of the amplifier with responding to the enable signal.

* * * * *